United States Patent
Curtis et al.

(10) Patent No.: US 10,431,914 B2
(45) Date of Patent: Oct. 1, 2019

(54) NETWORK CONNECTOR ASSEMBLY

(71) Applicant: Cisco Technology, Inc., San Jose, CA (US)

(72) Inventors: George Edward Curtis, San Jose, CA (US); Amrik S. Bains, Livermore, CA (US); Ken Naumann, Livermore, CA (US); Mike Sapozhnikov, San Jose, CA (US)

(73) Assignee: CISCO TECHNOLOGY, INC., San Jose, CA (US)

( * ) Notice: Subject to any disclaimer, the term of this patent is extended or adjusted under 35 U.S.C. 154(b) by 0 days.

(21) Appl. No.: 15/661,334

(22) Filed: Jul. 27, 2017

(65) Prior Publication Data
US 2019/0036252 A1    Jan. 31, 2019

(51) Int. Cl.
| H01R 12/72 | (2011.01) |
| H01R 12/70 | (2011.01) |
| H01R 24/64 | (2011.01) |
| H05K 1/14 | (2006.01) |
| H01R 13/514 | (2006.01) |
| H01R 13/518 | (2006.01) |
| H01R 13/659 | (2011.01) |
| H01R 25/00 | (2006.01) |
| H01R 107/00 | (2006.01) |

(52) U.S. Cl.
CPC ....... *H01R 12/727* (2013.01); *H01R 12/7023* (2013.01); *H01R 12/722* (2013.01); *H01R 13/514* (2013.01); *H01R 13/518* (2013.01); *H01R 13/659* (2013.01); *H01R 24/64* (2013.01); *H01R 25/006* (2013.01); *H05K 1/14* (2013.01); *H01R 2107/00* (2013.01)

(58) Field of Classification Search
CPC .. H01R 12/727; H01R 12/7023; H01R 24/64; H01R 13/514; H01R 13/659; H01R 13/6658; H05K 1/14
See application file for complete search history.

(56) References Cited

U.S. PATENT DOCUMENTS

| 6,068,502 A | * | 5/2000 | Kuo | ................... H01R 12/7023 439/353 |
| 6,210,236 B1 | | 4/2001 | Kan | |
| 6,474,999 B1 | * | 11/2002 | Givens | ................... H01R 24/64 439/38 |

(Continued)

OTHER PUBLICATIONS

"RJ Stacked Modular Jack," Sun Jun Electronics inc., accessed on Jul. 27, 2017, pp. 1-2.

(Continued)

*Primary Examiner* — James Harvey
*Assistant Examiner* — Oscar C Jimenez
(74) *Attorney, Agent, or Firm* — Polsinelli PC

(57) ABSTRACT

A network connector assembly with an upper board member includes one or more upper coupling pins and a lower board member includes one or more lower coupling pins. The upper board member and lower board member each a plurality of sets of contact pins disposed on a respective top surface. A housing can be disposable over the upper board member and the lower board member forming one or more network couplers. Each of the one or more network couplers configured to receive one set of contact pins.

20 Claims, 12 Drawing Sheets

(56) References Cited

U.S. PATENT DOCUMENTS

| | | | | |
|---|---|---|---|---|
| 6,655,988 B1* | 12/2003 | Simmons | ............ | H01R 13/6641 439/490 |
| 7,025,635 B2* | 4/2006 | Chang | ................. | H01R 13/6581 439/620.07 |
| 7,033,210 B1* | 4/2006 | Laurer | ................. | H01R 13/506 439/541.5 |
| 7,048,550 B2 | 5/2006 | Hyland et al. | | |
| 7,074,083 B2* | 7/2006 | Hyland | .............. | H01R 13/6658 439/607.01 |
| 7,335,056 B1* | 2/2008 | Clark | ................... | H01R 13/518 439/534 |
| 7,361,053 B1 | 4/2008 | Boone et al. | | |
| 7,670,172 B2* | 3/2010 | Zhang | ................... | H01R 24/64 439/540.1 |
| 7,674,136 B2* | 3/2010 | Steinke | ................ | H01R 13/514 439/541.5 |
| 8,096,833 B2 | 1/2012 | Tobey | | |
| 8,579,661 B2 | 11/2013 | Zhang | | |
| 8,951,068 B2* | 2/2015 | Tai | ......................... | H01R 12/52 439/620.18 |
| 2003/0077942 A1* | 4/2003 | Givens | ............... | H01R 13/7175 439/620.18 |
| 2005/0255746 A1* | 11/2005 | Hyland | .............. | H01R 13/6658 439/541.5 |
| 2008/0102699 A1 | 5/2008 | Chen | | |
| 2008/0305680 A1* | 12/2008 | Little | ................... | H01R 13/514 439/541.5 |
| 2008/0305692 A1* | 12/2008 | Little | ................. | H01R 13/6658 439/676 |

OTHER PUBLICATIONS

International Search Report and Written Opinion from the International Searching Authority, dated Oct. 9, 2018, 16 pages, for the corresponding International Application PCT/US2018/043396.

* cited by examiner

NETWORK CONNECTOR ASSEMBLY

FIELD

The present disclosure relates generally to network connectors.

BACKGROUND

Network connectors are built in pairs with an upper and lower port and include a printed circuit board. The connectors have contacts, called "chicklets", loaded into a connector housing with one chicklet implemented for the upper port and another chicklet implemented for the lower port. Multiple pairs of connectors can be used in combination to form 4, 8, 12, 24, and 48 port network devices. Existing network connectors require multiple installation steps and tests to verify individual portions of the modules and complete assembly. Due to the high number of connections and assembly steps, these modules often have high failure rates which reduce overall production yields.

BRIEF DESCRIPTION OF THE DRAWINGS

Implementation of the present technology will now be described, by way of example only, with reference to attached figures, wherein.

Figure 1:
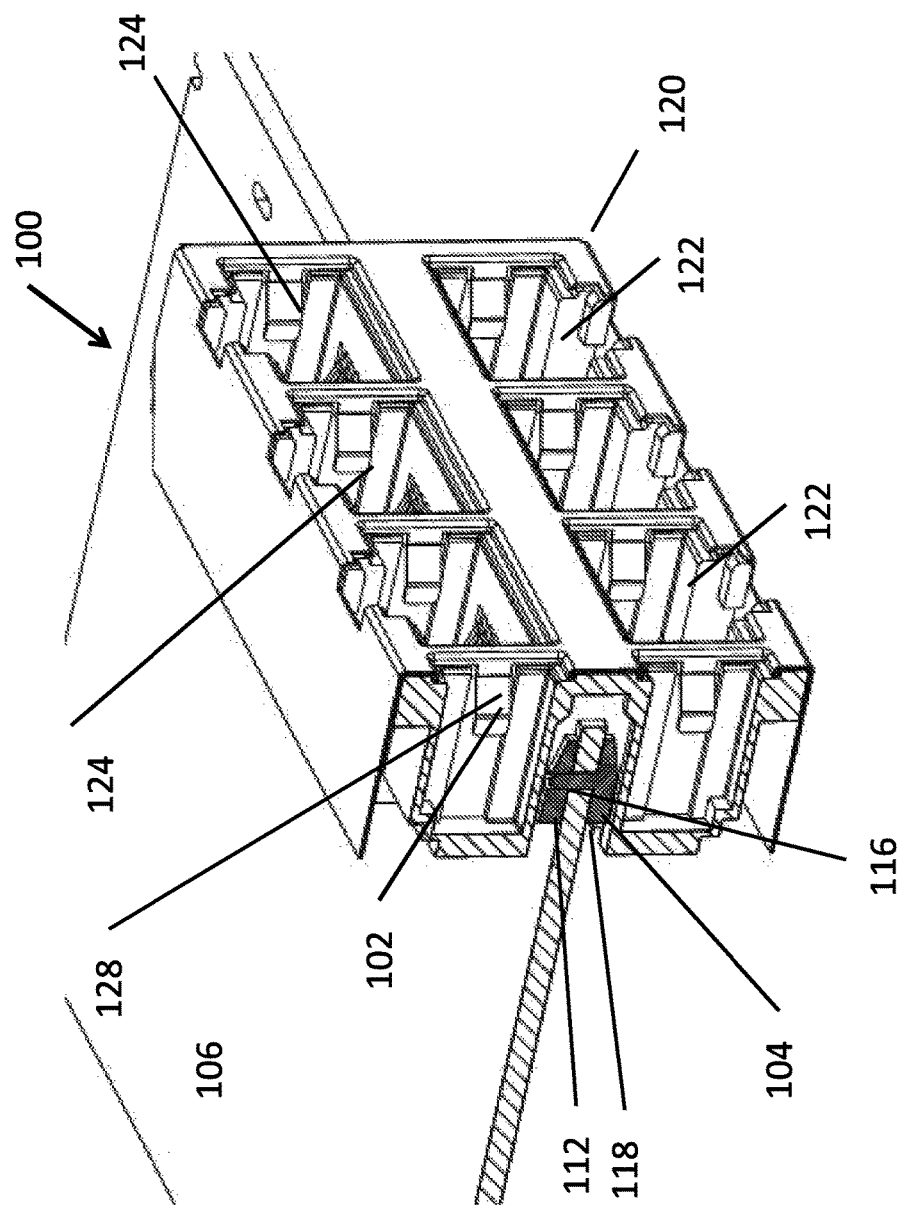
FIG. 1 is a partial cut away view of a network connector assembly according to a first example of the present disclosure.

The various examples described above are provided by way of illustration only, may not be shown to scale, and should not be construed to limit the scope of the disclosure.

DESCRIPTION OF EXAMPLE EMBODIMENTS

For simplicity and clarity of illustration, where appropriate, reference numerals have been repeated among the different figures to indicate corresponding or analogous elements. In addition, numerous specific details are set forth in order to provide a thorough understanding of the implementations described herein. However, those of ordinary skill in the art will understand that the implementations described herein can be practiced without these specific details. In other instances, methods, procedures and components have not been described in detail so as not to obscure the related relevant feature being described. Also, the description is not to be considered as limiting the scope of the implementations described herein.

Several definitions that apply throughout this disclosure will now be presented. "Coupled" refers to the linking or connection of two objects. The coupling can be direct or indirect. An indirect coupling includes connecting two objects through one or more intermediary objects. Coupling can also refer to electrical or mechanical connections. Coupling can also include magnetic linking without physical contact. "Substantially" refers to an element essentially conforming to the particular dimension, shape or other word that substantially modifies, such that the component need not be exact. For example, substantially cylindrical means that the object resembles a cylinder, but can have one or more deviations from a true cylinder. The term "comprising" means "including, but not necessarily limited to"; it specifically indicates open-ended inclusion or membership in a so-described combination, group, series and the like.

Even though numerous characteristics and advantages of the present technology have been set forth in the following description, together with details of the structure and function of the present disclosure, the disclosure is illustrative only, and changes can be made in the detail, especially in matters of shape, size and arrangement of the parts within the principles of the present disclosure to the full extent indicated by the broad general meaning of the terms used in the attached claims. It will therefore be appreciated that the examples described above can be modified within the scope of the appended claims. Claim language reciting "at least one of" a set indicates that one member of the set or multiple members of the set satisfy the claim. For example, at least one of A, B, and C, indicates the members can be just A, just B, just C, A and B, A and C, B and C, or A, B, and C.

Overview

The present disclosure is drawn to a network connector having an upper board member and a lower board member. Each of the upper board member and the lower board member has one or more alignment pins and an off center coupling pin extending from a bottom surface and a plurality of sets of contact pins disposed on a top surface. A housing can be disposable over the upper board member and the lower board member and thus form one or more network couplers. Each of the one or more network couplers configured to receive one of the plurality of sets of contact pins, and in connection with the housing form a network connector.

The present disclosure is also drawn to a network connector assembly having a housing forming a plurality of network couplers. The housing includes an upper board member having one or more upper coupling pins and a lower board member having one or more lower coupling pins. Each of the one or more upper coupling pins and the one or more lower coupling pins are configured to engage with a corresponding securement groove formed in the housing. The housing is configured to be coupled with a printed circuit board and each of the plurality of network couplers is configured to receive one set of contact pins.

The present disclosure is further drawn to a network connector assembly having an upper board member with one or more upper coupling pins and a lower board member with one or more lower coupling pins. The upper board member and the lower board member each having a plurality of sets of contact pins disposed on a respective top surface. A housing disposable over the upper board member and the lower board member forming one or more network couplers. Each of the one or more network couplers configured to receive one set of contact pins.

Example Embodiments

FIG. 1 is a cross-section of a network connector assembly according to the present disclosure. A network connector assembly 100 can have an upper board member 102 and a lower board member 104. The upper board member 102 and the lower board member 104 can be configured to couple with a printed circuit board (PCB) 106. The upper board member 102 can have one or more upper alignment pins 108 and an off-center upper coupling pin 110 (shown more clearly in FIG. 4) extending from a bottom surface 112. The off-center upper coupling pin 110 can be off-center with respect to the length 10 of the upper board member 102.

The lower board member 104 can have one or more lower alignment pins 114 (shown more clearly in FIG. 4) and an off-center lower coupling pin 116 extending from a bottom surface 118. The off-center lower coupling pin 116 can be off-center with respect to the length 10 of the lower board member 104.

The off-center lower coupling pin 116 can extend from the bottom surface 118, through the PCB 106 and into an aperture 134 formed in the upper board member 102. Similarly, the off-center upper coupling pin 110 can extend from the bottom surface 112, through the PCB 106 and into an aperture 134 formed in the lower board member 104, thereby securing the upper board member 102 and the lower board member 104 to the PCB 106.

A housing 120 can be disposed over the upper board member 102 and the lower board member 104. The housing 120 can have a plurality network couplers 122, for example RJ-45 connectors. The upper board member 102 can have a plurality of sets of contact pins 124 and the lower board member 104 can have a plurality of sets of contact pins 126. Each set of contact pins 124, 126 can be referred to as a "chicklet." The housing 120 can receive a set of contact pins 124 from one of the upper board member 102 or the lower board member 104 into each of the one or more network couplers 122.

The housing 120 can be secured to the upper board member 102 and the lower board member 104 by a latching mechanism 128. The housing 120 and the latching mechanism 128 can form a pressure-fit coupling with the upper board member 102 and the lower board member 104.

Figure 2:
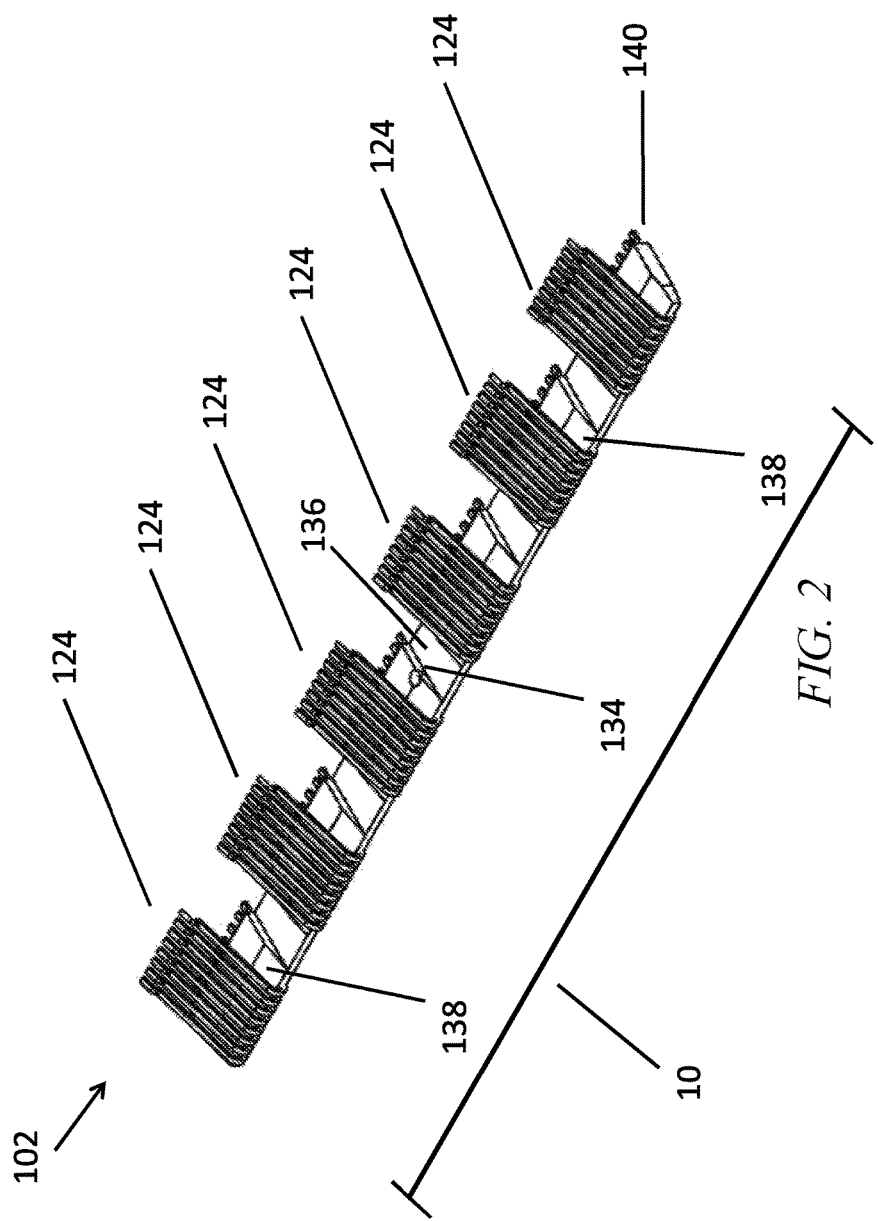
FIG. 2 is an isometric view of a board member of a network connector assembly according to a first example of the present disclosure.

FIG. 2 shows an upper board member of a network connector assembly according to the present disclosure. The upper board member 102 and the lower board member 104 can be identical, and thus interchangeable. While FIG. 2 is described with respect to an upper board member 102, the following description is representative of both an upper board member 102 and a lower board member 104.

The upper board members 102 can extend length 10 and have substantially evenly spaced sets of contact pins 124 disposed along the length 10. The upper board member 102 can have an aperture 134 formed off-center relative to the length 10. In some instances, the aperture 134 can extend from the bottom surface 112 through a top surface 136. In other instances, the aperture 134 can extend through the bottom surface 112, but not through the top surface 136. The aperture 134 can be configured to receive the off-center coupling pin 110, 116 of the opposing board member 102, 104. The top surface 136 can be substantially flat providing a smooth surface for use with a pick and place machine.

The upper board member 102 details a plurality of sets of contact pins 124 extending above the top surface 136. Each set of contact pins 124 can be angled relative to the top surface 136, thus allowing compression and a pressure fit when receiving a male cable terminator into a corresponding network coupler 122. While each set of contact pins 124 is detailed with eight (8) pins, any number of contact pins can be implemented. For example, the set of contact pins 124 can have six (6), ten (10), twelve (12), or any other number of contact pins.

Figure 3:
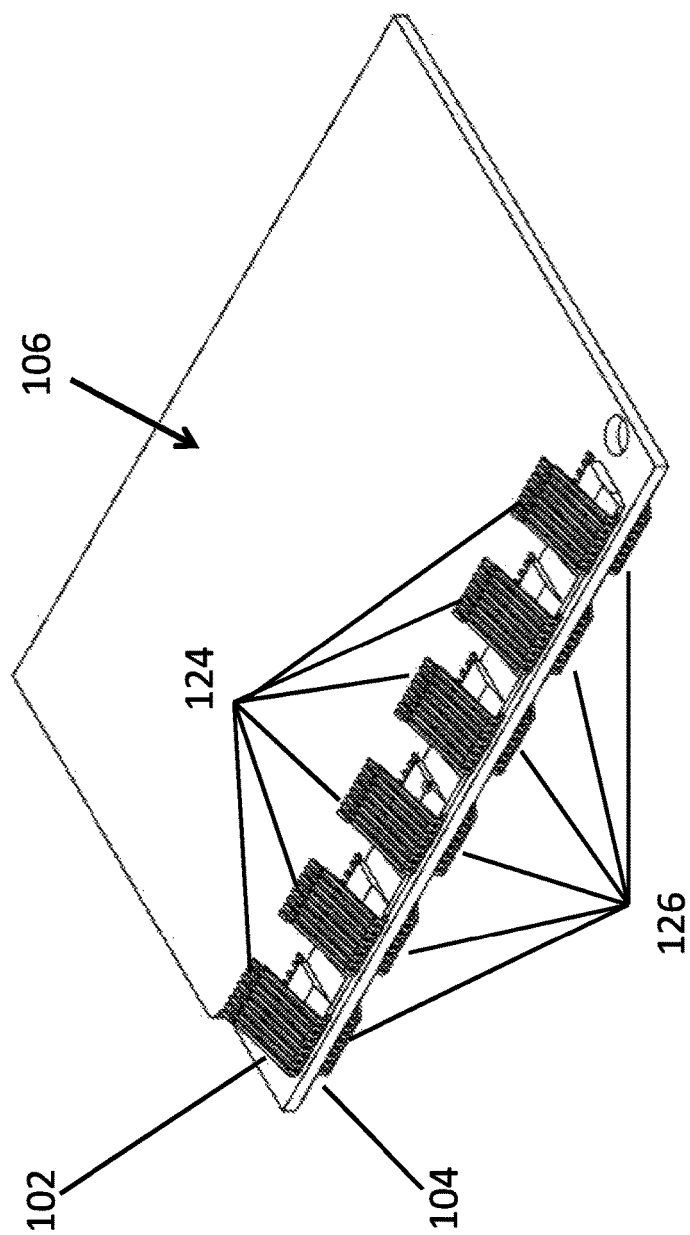
FIG. 3 is an isometric view of an upper board member and lower board member coupled with a printed circuit board according to a first example of the present disclosure.

FIG. 3 shows an upper board member and a lower board member coupled with a PCB according to the present disclosure. The PCB 106 can receive the upper board member 102 and the lower board member 104 along one edge of the PCB 106. The plurality set of contact pins 124 of the upper board member and the plurality set of contact pins 126 of the lower board member are substantially aligned above and below the PCB 106.

The pins of the plurality of sets of contacts pins 124 can extend beyond the rear surface 140 of the upper board member 102. The extension of the pins can allow soldering of the pins to the PCB 106. The pins of the plurality sets of contact pins 126 can similarly extend beyond the rear surface of the lower board member 104, thus allowing soldering of the pins to the PCB 106.

The lower board member 104 can be placed onto the PCB 106 and aligned using the one or more lower alignment pins 114 and off-center lower coupling pin 116. The lower board member 104 can then be soldered into place. The upper board member 102 can then be positioned onto the PCB 106 aligned using the one or more upper alignment pins 108 and off-center upper coupling pin 110. The upper board member 102 can then be soldered into place on the PCB 106. The upper board member 102 and lower board member 104 implementing self-aligning pins minimizes the tolerance between the two board members 102, 104 and provides self-aligning of the housing 120.

Figure 4:
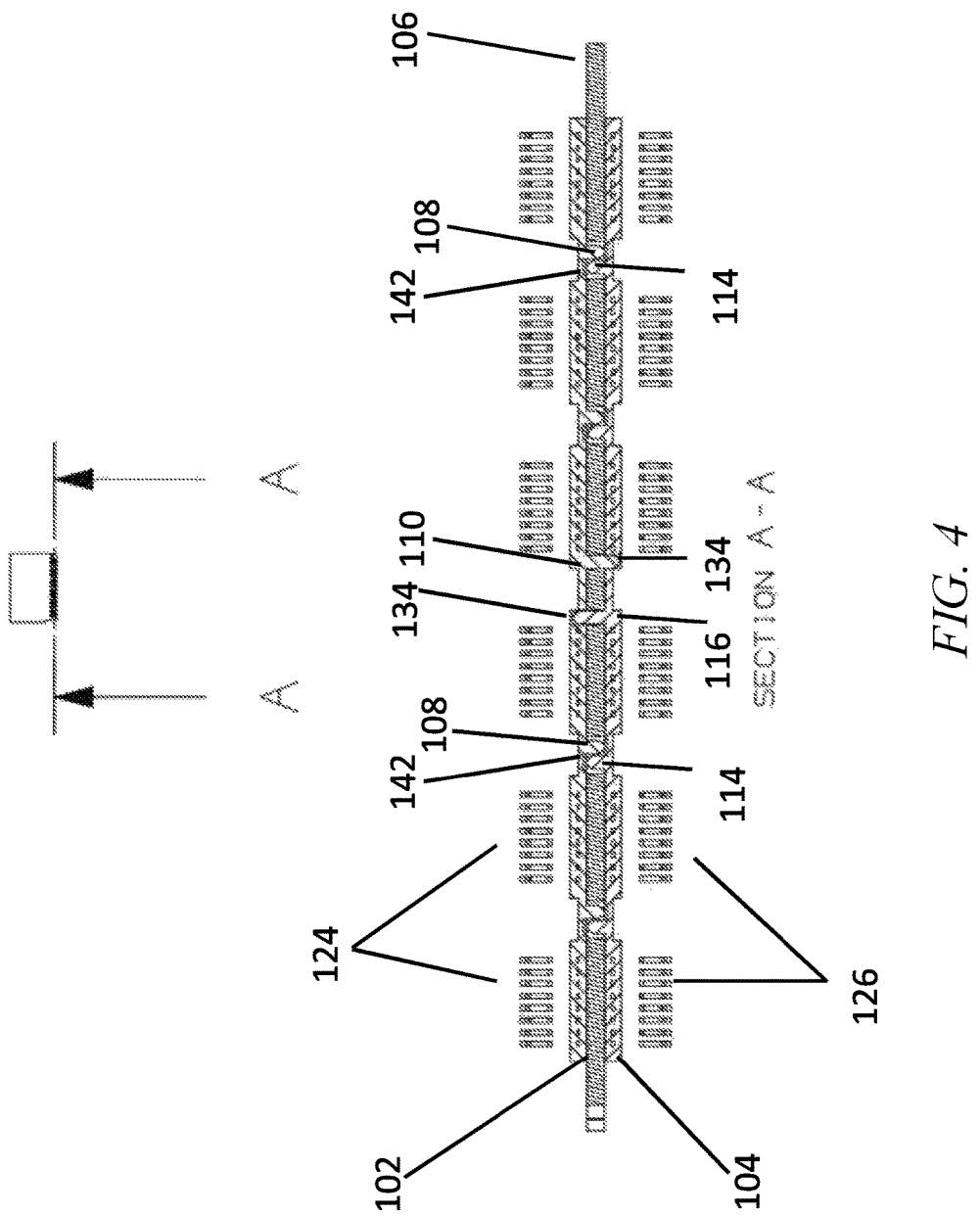
FIG. 4 is a cross-section view of FIG. 3 taken along line A-A.

FIG. 4 shows a cross section view of an upper board member and lower board member coupled with a PCB according to the present disclosure. The upper board member 102 has one or more upper alignment pins 108 extending from bottom surface 112 and the lower board member 104 has one or more lower alignment pins 114 extending from bottom surface 118. The upper alignment pins 108 and lower alignment pins 114 can be received in corresponding apertures 142 formed in the PCB. Each corresponding aperture 142 can receive one upper alignment pin 108 and one lower alignment pin 114. In other examples, each corresponding aperture 142 can receive either an upper alignment pin 108 or a lower alignment pin 114, individually. The upper alignment pins 108 position the upper board member 102 on the PCB 106 and the lower alignment pins 114 position the lower board member 104 on the PCB 106. While the illustrated example details four upper alignment pins 108 and four lower alignment pins 114, the upper board member 102 and lower board member 104 can be implemented with any number of alignment pins 108, 114, for example, one, two, three, five, or any other number of alignment pins 108, 114.

The upper board member 102 can have off-center coupling pin 110 extending from bottom surface 112, through the PCB 106, and into aperture 134 formed on the lower board member 104. The off-center upper coupling pin 110 can form a pressure-fit securement with the lower board member 104. Similarly, the lower board member 104 can have off-center lower coupling pin 116 extending from bottom surface 118, through the PCB 106, and into an aperture 134 formed on the upper board member 104. The off-center lower coupling pin 116 can form a pressure-fit securement with the upper board member 102. Off-center coupling pins 110, 116 can secure the upper board member 102 and lower board member 104 to the PCB 106. The off-center arrangement of the coupling pins 110, 116 can allow the interchangeability between the upper board member 102 and the lower board member 104.

Figure 5:
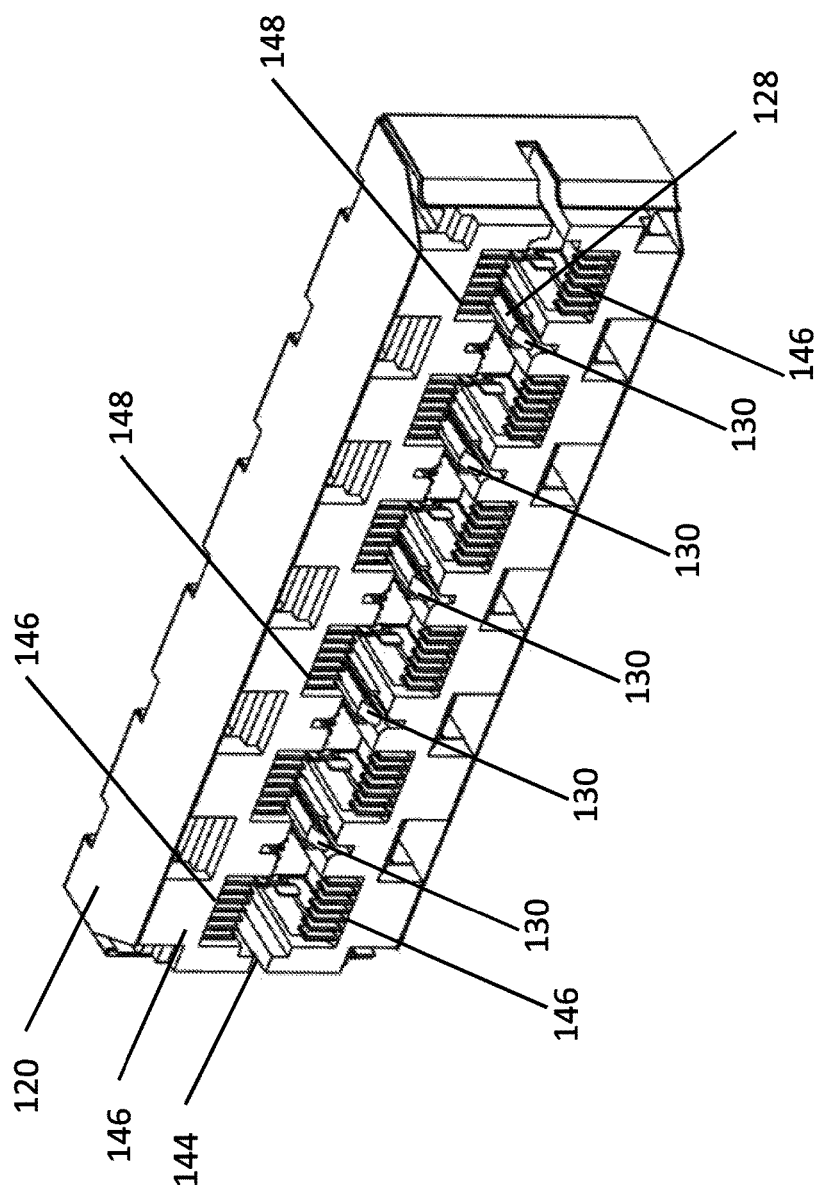
FIG. 5 is a rear isometric view of a housing of a network connector assembly according to the a first example of present disclosure.

FIG. 5 shows a rear isometric view of a housing according to the present disclosure. The housing 120 can have a board receiving portion 144 formed on a back side 146. The board receiving portion 144 can be substantially slot-shaped and configured to receive the PCB 106 therein. The back side 146 can further have a plurality of pin sets receivers 148. Each of the pin set receivers 148 can be configured to receive one set of contact pins 124, 126 disposed on either of the upper board member 102 or the lower board member 104.

The housing 120 can form a plurality of network couplers 122 aligned with each pin set receiver 148. The housing 120 can form any number of network couplers 122 corresponding to the plurality set of contact pins 124, 126 disposed on the upper board member 102 and lower board member 104. For example, the housing 120 can have four (4), eight (8), twelve (12), twenty four (24), forty eight (48), or any other number of network couplers 122 though generally in pairs.

As described above, the latching mechanism 128 can secure the housing 120 with the upper board member 102, lower board member 104, and the PCB 106. The latching mechanism 128 can provide one or more securement tabs 130. The securement tabs 130 can be disposed within the board receiving portion 144 and be displaceable as the PCB 106 is received within the board receiving portion 144. The securement tabs 130 can be compressible, or otherwise displaceable, to allow at least a portion of the upper board member 102 and/or the lower board member 104 to be received in a within the board receiving portion 144. The securement tabs 130 can decompress, e.g. return to original form, after receiving the upper board member 102 and/or the lower board member 104, thereby securing the housing 120 to the PCB 106 having an upper board member 102 and lower board member 104 coupled thereto.

The one or more securement tabs 130 can be configured to engage with either the upper board member 102, the lower board member 104, or any combination thereof. After coupling the housing 120, the securement tabs 130 can be displaced again to allow the housing 120 to be de-coupled as needed.

Figure 6:
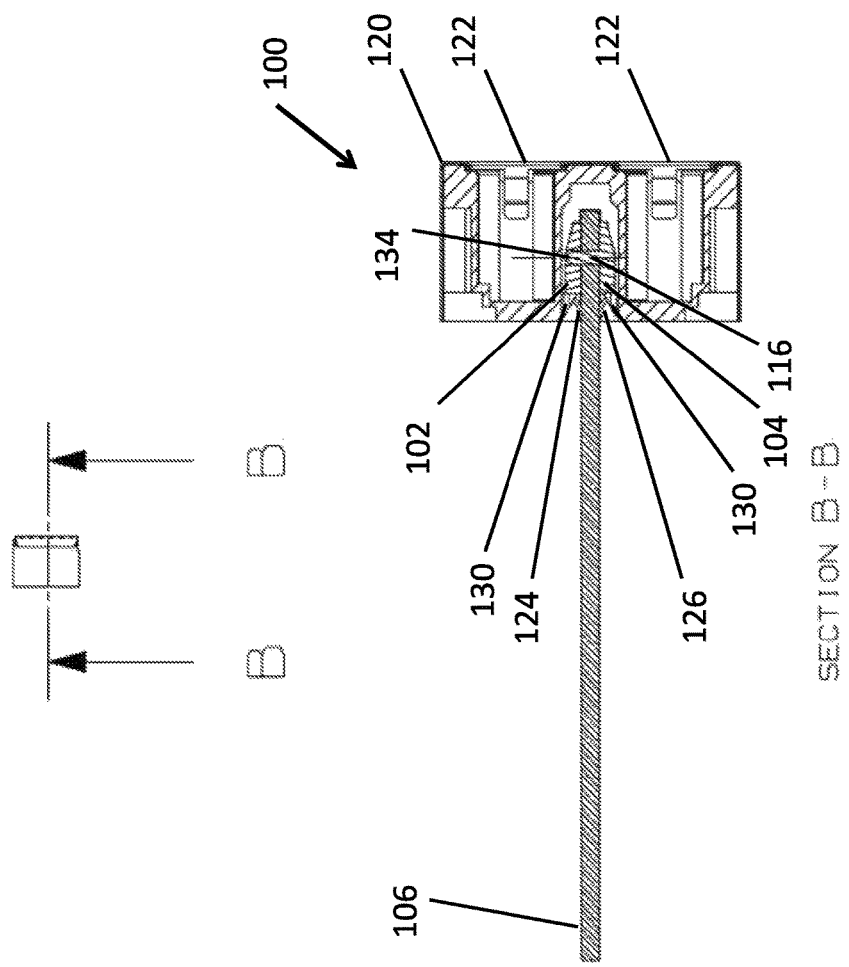
FIG. 6 is a cross-section view of a network connector assembly according to a first example of the present disclosure.

FIG. 6 shows a cross-section view of a housing coupled with a PCB having an upper board member 102 and lower board member 104 coupled thereto according to the present disclosure. The securement tabs 130 are detailed in an uncompressed state and received over the upper board member 102 and the lower board member 104. The lower off-center coupling pin 116 extends from the bottom surface 118 of the lower board member 104 and is received into the aperture 134 formed on the upper board member 102. The off-center coupling pins 110, 116 secure the upper board member 102 and the lower board member 104 to the PCB 106.

The contact pins 124, 126 extending behind the upper board member 102 and lower board member 104 can be in contact with the PCB 106 and held into electrical connective coupling by solder.

The network connector assembly 100 can utilize remote circuitry placed on the PCB 106 in any desired location having the necessary circuits, filters, and the like to support the desired network couplers 122.

Figure 7:
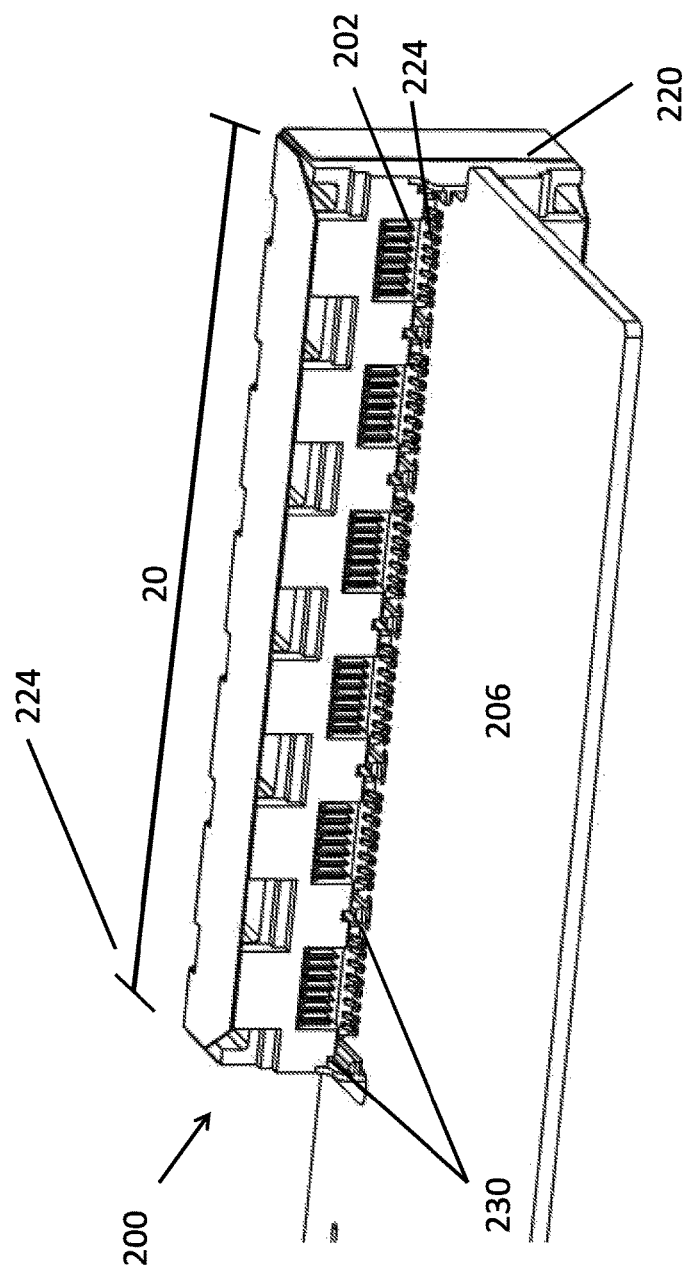
FIG. 7 is rear view of a network connector assembly according to a second example of the present disclosure.

FIG. 7 shows a network connector assembly according to the present disclosure. A network connector assembly 200 can have an upper board member 202 and a lower board member 204. The upper board member 202 and the lower board member 204 can be configured to engage with a PCB 206. The upper board member 202 can have one or more upper coupling pins 210 extending from a rear surface 212 (shown more clearly in FIGS. 8 and 12).

The lower board member 204 can have one or more lower coupling pins 216 (shown more clearly in FIG. and 12) extending from the rear surface 218. The one or more upper coupling pins 210 and one or more lower coupling pins 216 can engage with a housing 220 to secure the upper board member 202 and the lower board member 204 within the network connector assembly 200.

The housing 220 can be disposed over the upper board member 202 and the lower coupling member 204. The housing 220 can have a plurality network couplers 222, for example an RJ-45 connectors. The upper board member 202 can have a plurality of sets of contact pins 224 and the lower board member 204 can have a plurality of sets of contact pins 226. The housing 220 can receive a set of contact pins 224, 226 from either the upper board member 202 or the lower board member 204 into each of the one or more network couplers 222.

Figure 8:
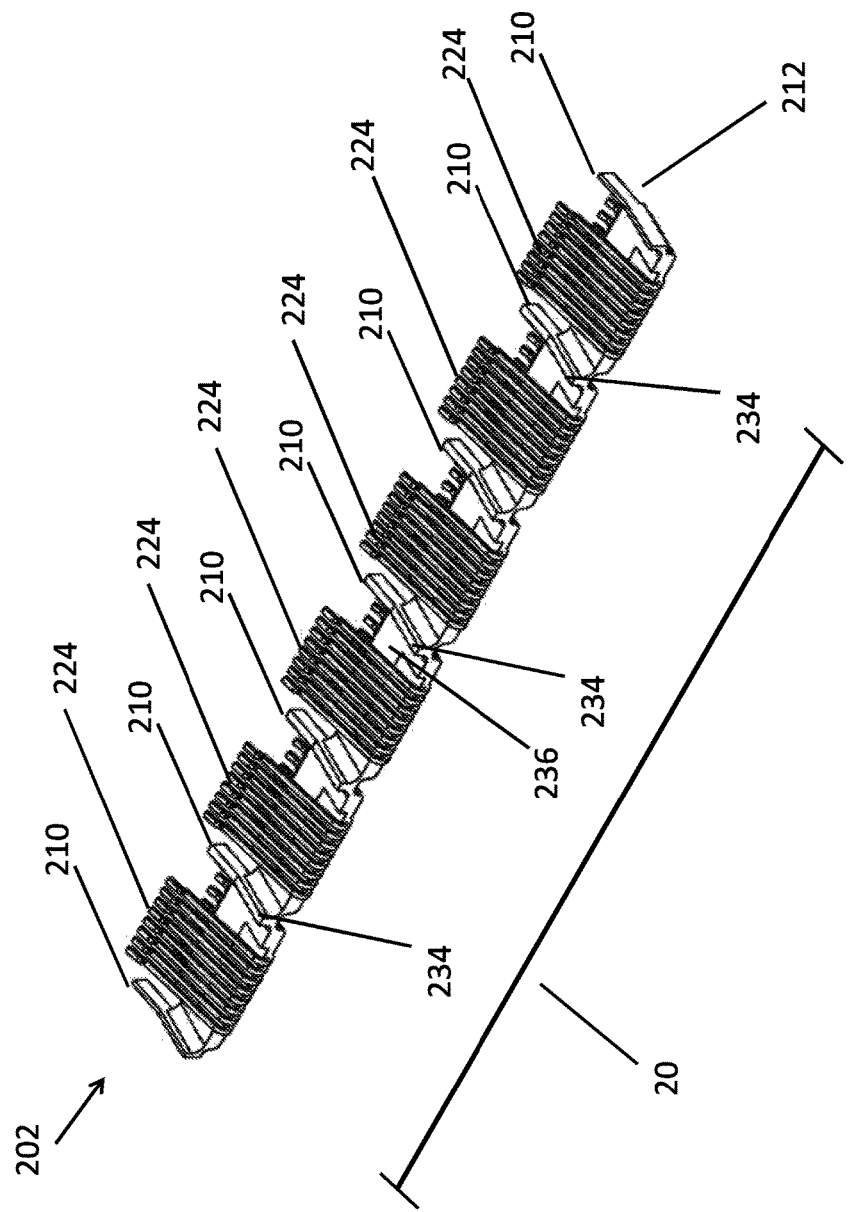
FIG. 8 is an isometric view of a board member of a network connector assembly according to a second example of the present disclosure.

FIG. 8 shows a board member of a network connector assembly according to the present disclosure. The upper board member 202 and the lower board member 204 can be identical, interchangeable, and otherwise indistinguishable. While the follow is described with respect to an upper board member 202, the description is equally and similarly applicable to a lower board member 204.

The upper board member 202 can extend length 20 and have substantially evenly spaced plurality of set of contact pins 224 disposed along the length 20.

The upper board member 202 has one or more coupling pins 210 extending from the rear surface 212. Each of the one or more coupling pins 210 can be angled upward relative to a top surface 236 of the upper board member and at least partially displaceable. The coupling pin 210 can be receivable within a corresponding groove formed in the housing 220. When the housing 220 is disposed over the upper board member, the one or more coupling pins 210 can displace downward toward the top surface 236 and the return to their original shape upon entering the corresponding groove, thereby securing the upper board member 202 to the housing 220. In other instances, the one or more coupling pins 210 can be rigid, non-displaceable pins and be positioned within the housing 220 and the corresponding groove and held in place upon coupling of the PCB 206.

The upper board member 202 details the plurality of sets of contact pins 224 extending above the top surface 236. Each set of contact pins 224 can be angled relative to the top surface 236, thus allowing compression and a pressure fit when receiving a male cable terminator into a corresponding network coupler 222. While each set of contact pins 224 is detailed with eight (8) pins, any number of contact pins can be implemented. For example, the set of contact pins 224 can have six (6), ten (10), twelve (12), or any other number of contact pins. The top surface 236 can be substantially flat providing a smooth surface for use with a pick and place machine.

The upper board member 202 can also include one or more alignment ridges 234 extending from the top surface 236. The one or more alignment ridges 234 can be received in a corresponding alignment slots formed in a rear surface of the housing 220. The one or more alignment ridges 234 can assist in aligning the upper board member 202 during coupling with the housing 220. The upper board member 202 can have an alignment ridge 234 disposed between each of the plurality set of contact pins 224 along with an alignment ridge 234 on each exterior edge. In at least one instance, the one or more alignment ridges 234 have individual shapes corresponding to the appropriate alignment slot, thus ensuring proper assembly. The corresponding shape can be any shape including, but not limited to, circular, square, triangular, oval, star pattern, or any other pattern.

Figure 9:
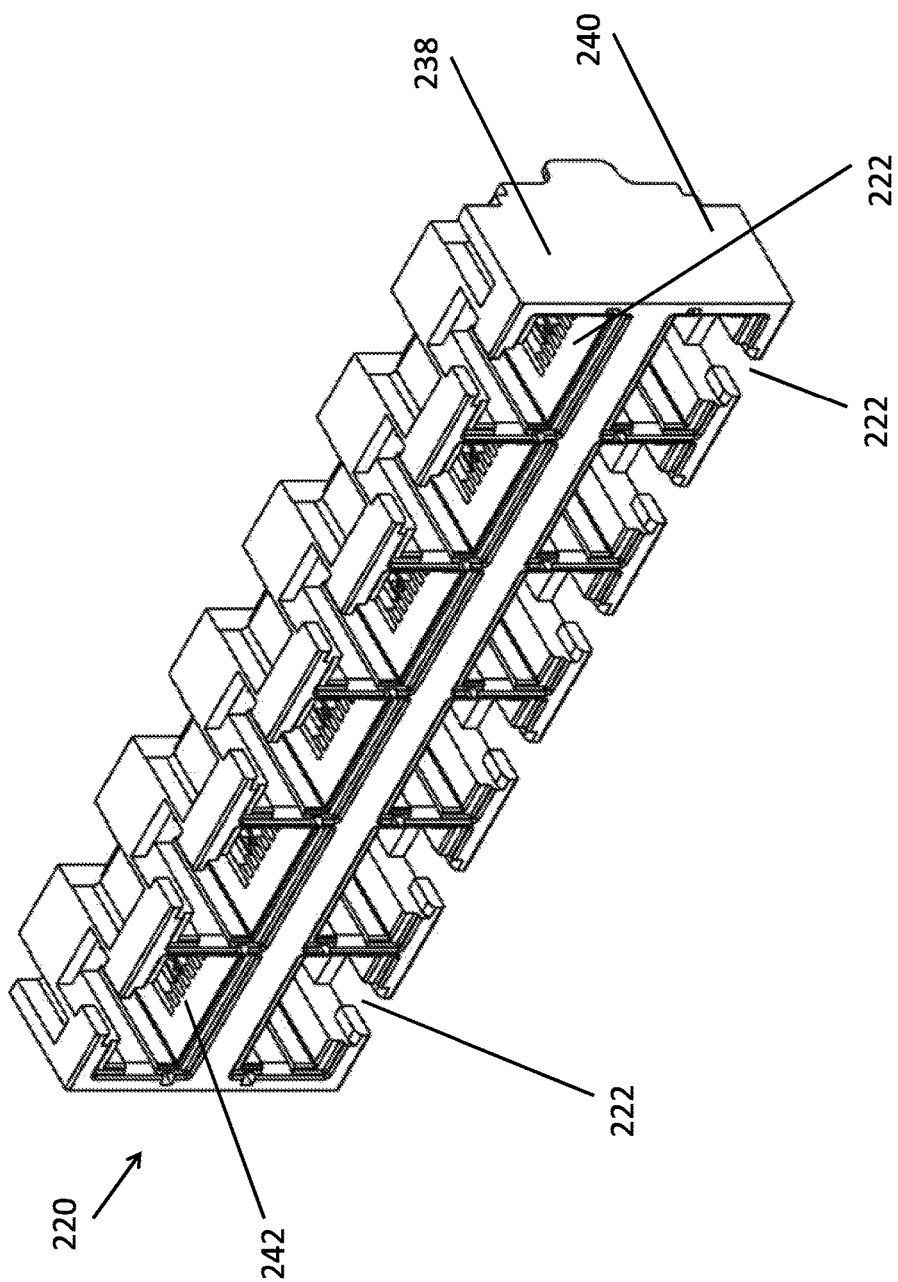
FIG. 9 is a front isometric view of a board member of a network connector assembly according to a second example of the present disclosure.

FIG. 9 shows a housing of a network connector assembly according to the present disclosure. The housing 220 can form a plurality of network couplers 222 arranged in an upper row 238 and a lower row 240. The upper row 238 can correspond to the upper board member and the lower row 240 can correspond to the lower board member. After coupling of the upper board member 202 and the lower board member 204 with the housing 220, each of the plurality of network couplers 222 receives a set of contact pins 224, 226 from one of the upper board member 202 and the lower board member 204 in a contact pin receiving area 242.

Figure 10:
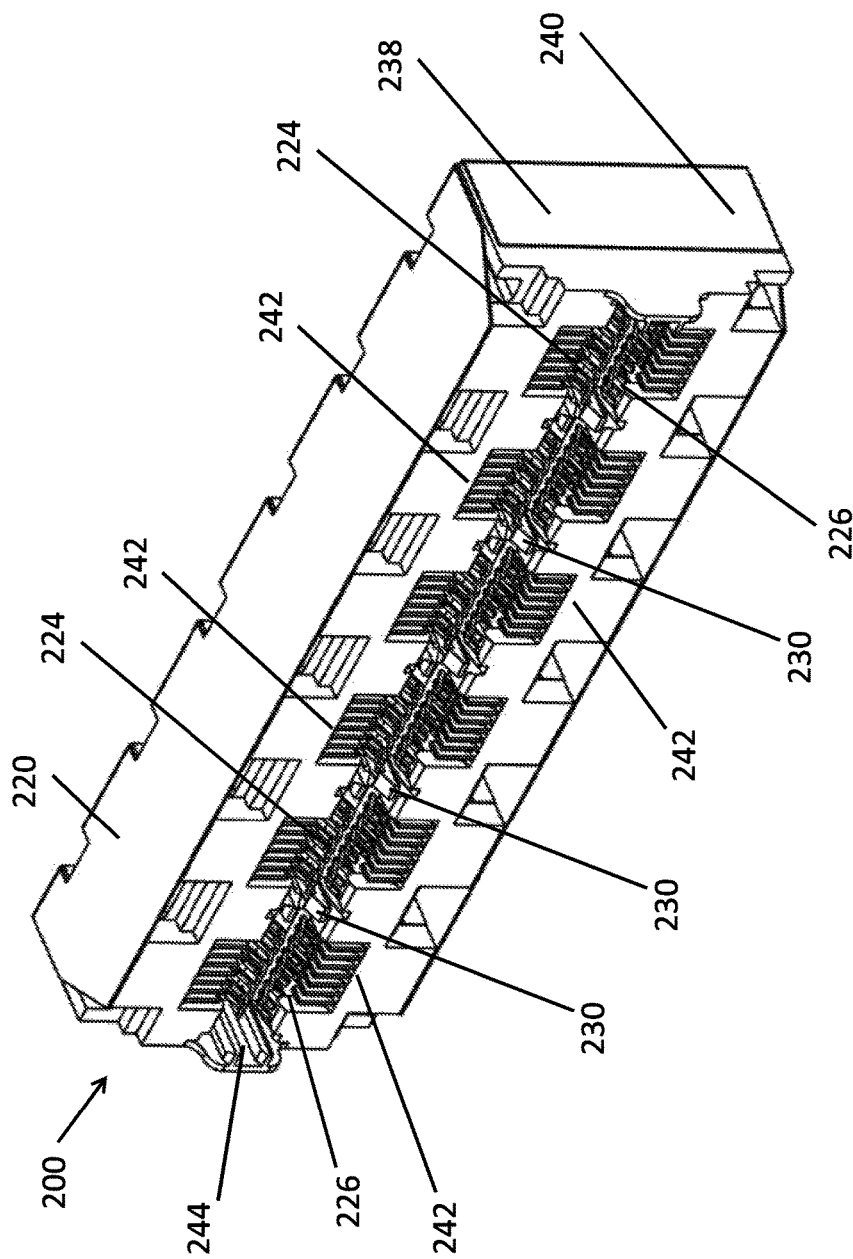
FIG. 10 is a rear isometric view of a housing of a network connector assembly according to a second example of the present disclosure.
Figure 11:
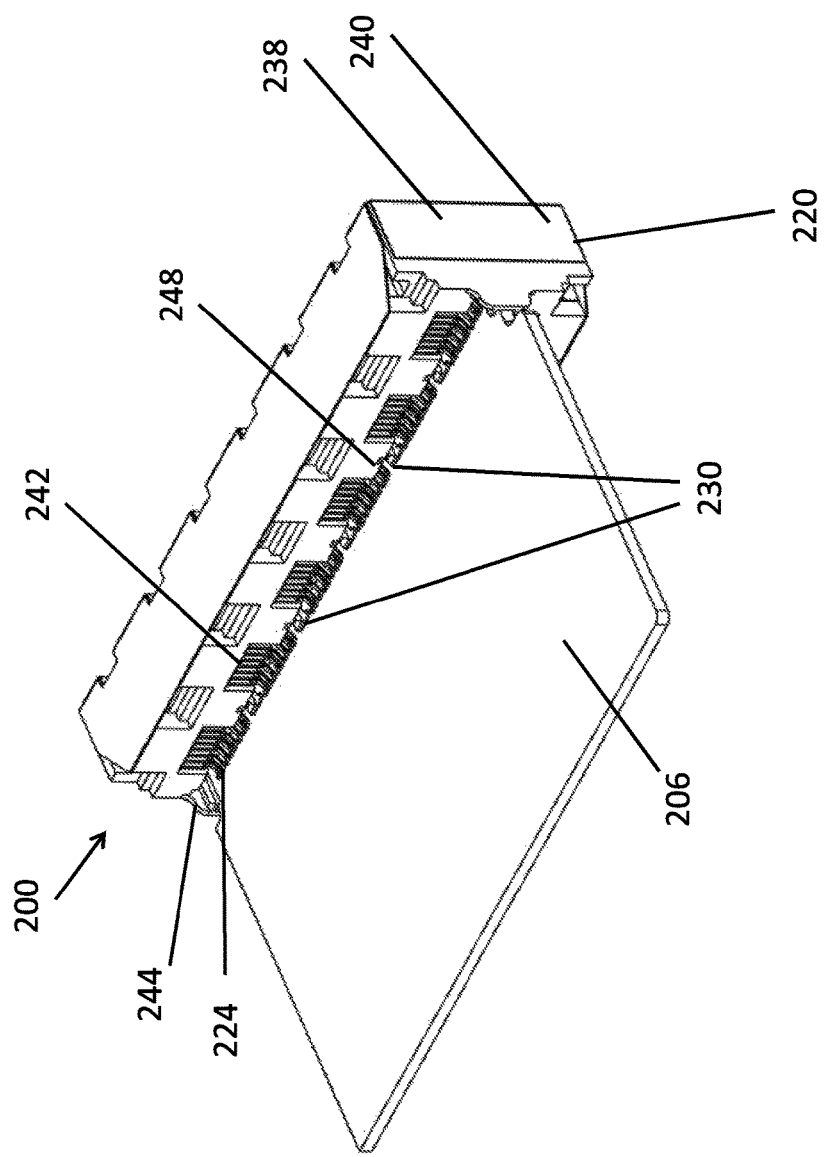
FIG. 11 is a rear isometric view of a network connector assembly according to a second example of the present disclosure.

FIG. 10 shows a rear review of a network connector assembly having a housing having an upper board member and a lower board member coupled thereto according to the present disclosure. FIG. 11 shows a network connector assembly coupled with a PCB according to the present disclosure. The housing 220 can receive the upper board member 202 and the lower board 204 therein. The housing 220 can have a board receiving portion 244 configured to receive at least a portion of the PCB 206. The board receiving portion 244 can separate the upper row 238 and the lower row 240, thus placing the upper row 238 above the PCB 206 and the lower row 240 below the PCB 206.

Figure 12:
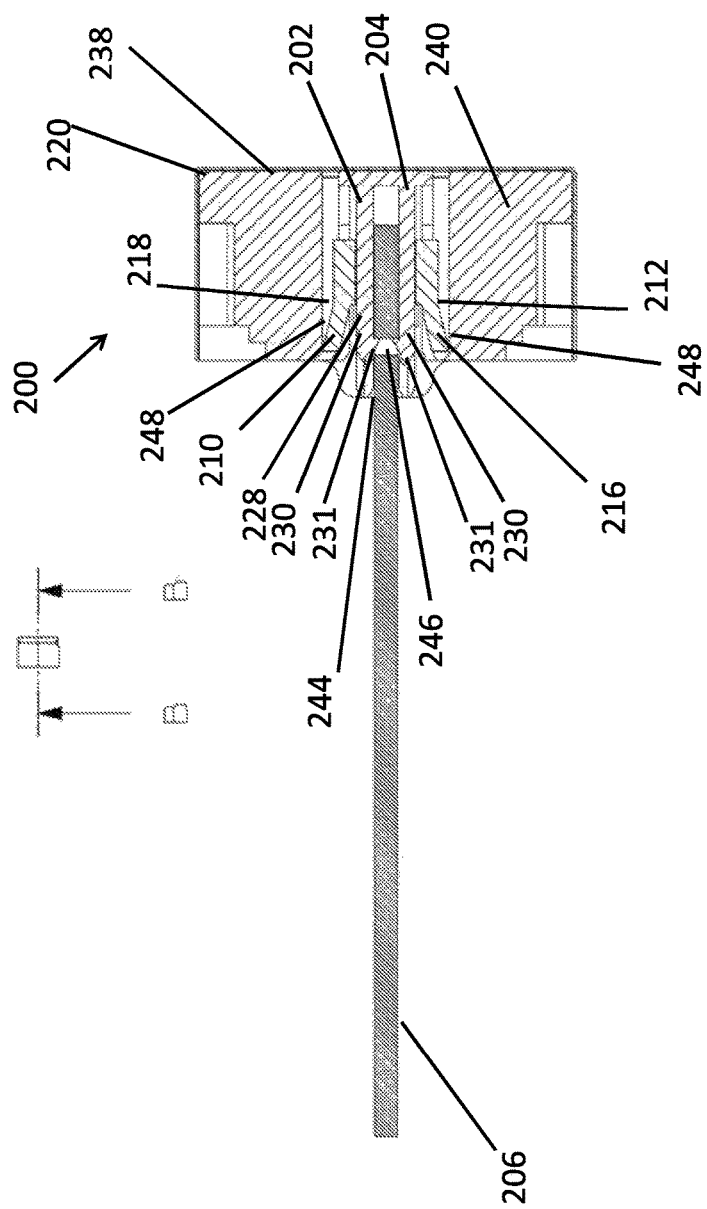
FIG. 12 is a cross-section view of a network connector assembly according to a second example of the present disclosure.

FIG. 12 shows a cross-section view of network connector assembly coupled with a PCB according to the present disclosure. The network connector assembly 200 can receive the PCB 206 in the board receiving portion 244. The PCB 206 can have a one or more apertures 246 formed therethrough for coupling with the network connector assembly 200. The network assembly 200 can have a latching mechanism 228 having one or more protrusions 230 engageable with the one or more apertures 246 of the PCB 206. The network connector assembly 200 can have a protrusion 230 corresponding to each of the apertures 246 formed in the PCB 206.

In at least one instance, the protrusions 230 can be displaceable and have a tip 231 configured to engage at least a portion of the aperture 246. As the network connector assembly 200 is coupled with the PCB 206, the tip 231 of the protrusion 230 passing over the PCB can displace the protrusion until engaging the aperture 246. After the tip 231 engages the aperture 246, the protrusion 230 can return to original position. The aperture 246 can receive a tip 231 from the upper row 238 and a tip from the lower row 240 within the same aperture 246. The one or more protrusions 230 engaging with the one or more apertures 246 can secure the network connector assembly 200 to the PCB 206. The plurality set of contact pins 224, 226 can then be soldered to the PCB 206 for electrical connectivity.

The one or more apertures 246 can be placed on the PCB 206 to align with the one or more protrusions 230 of the network connector assembly 200 and ensure the plurality set of contact pins 224, 226 align with the necessary electrical circuitry for soldering.

As can be appreciated in FIG. 12, the upper coupling pins 210 secure the upper board member 202 within a corresponding groove 248 formed in the upper row 238 and the lower coupling pins 216 secure the lower board member 204 within a corresponding grove 246 in the lower row 240. The upper coupling pins 216 and the lower coupling pins 216 form a pressure engagement with the corresponding groove 248, thereby retaining the upper board member 202 and lower board member 204 within the housing 220.

While the present disclosure is described with respect to specific examples, one of ordinary skill in the art would appreciate that elements from each example can be implemented within other examples without deviating from the present disclosure.

It is believed the exemplary embodiment and its advantages will be understood from the foregoing description, and it will be apparent that various changes may be made thereto without departing from the spirit and scope of the disclosure or sacrificing all of its advantages, the examples hereinbefore described merely being preferred or exemplary embodiments of the disclosure.

What is claimed is:

1. A network connector assembly comprising:
   an upper board member having one or more upper alignment pins and an off-center upper coupling pin engaged with a printed circuit board, the upper board member having a first set of contact pins disposed on an upper board top surface;
   a lower board member having one or more lower alignment pins and an off-center lower coupling pin, each of the one or more lower alignment pins extending into an alignment pin aperture shared with one of the one or more upper alignment pins and formed in the printed circuit board, the off-center lower coupling pin extending upwardly from a bottom surface, through the printed circuit board, and into a coupling pin aperture formed in the upper board member, the lower board member having a second set of contact pins; and
   a housing disposed over the upper board member and the lower board member, the housing forming one or more network couplers, each of the one or more network couplers configured to receive one of the first set of contact pins or the second set of contact pins.

2. The network connector assembly of claim 1, wherein the off-center upper coupling pin is off-center relative to a lateral axis and the off-center lower coupling pin is off-center relative to the lateral axis.

3. The network connector assembly of claim 1, wherein the upper board member and the lower board member are interchangeable.

4. The network connector assembly of claim 1, wherein the housing forms an upper row of network couplers above the printed circuit board and a lower row of network couplers below the printed circuit board.

5. The network connector assembly of claim 1 wherein the housing is secured to the printed circuit board by a latching mechanism.

6. The network connector assembly of claim 5, wherein the latching mechanism has one or more securing tabs engageable with a securing tab aperture formed on the printed circuit board.

7. A network connector assembly comprising:
   a housing forming a plurality of network couplers, the housing comprising:
      an upper board member having one or more upper alignment pins and a set of upper contact pins, and
      a lower board member having one or more lower alignment pins, and a set of lower contact pins, and a protrusion extending upwardly from a bottom surface, through a printed circuit board, and into a coupling pin aperture formed in the upper board member,
   wherein,
      each of the one or more upper alignment pins extends into an alignment pin aperture shared with one of the one or more lower alignment pins and formed in the printed circuit board,
      the housing is configured to be coupled with the printed circuit board, and
      each of the network couplers receives the set of upper contact pins or the set of lower contact pins.

8. The network connector assembly of claim 7, wherein the upper board member and the lower board member are interchangeable.

9. The network connector assembly of claim 7, wherein,
   each of the one or more upper alignment pins and each of the one or more lower alignment pins extends a first length along the printed circuit board,
   the protrusion extends a second length along and past the printed circuit board.

10. The network connector assembly of claim 7, wherein the housing forms an upper row of network couplers above the printed circuit board and a lower row of network couplers below the printed circuit board.

11. The network connector assembly of claim 7, wherein the housing is secured to the printed circuit board by a latching mechanism.

12. The network connector assembly of claim 11, wherein the latching mechanism has another protrusion engaged with a protrusion aperture formed on the printed circuit board.

13. A network connector assembly comprising:
   an upper board member having one or more upper alignment pins, the upper board member having a first set of contact pins disposed on a top surface;
   a lower board member having one or more lower alignment pins, a second set of contact pins, and a securing tab extending upwardly from a bottom surface, through a printed circuit board, and into a securing tab aperture formed in the upper board member, each of the one or more lower alignment pins extending into an alignment pin aperture shared with one of the one or more upper alignment pins and formed in the printed circuit board; and
   a housing disposed over the upper board member and the lower board member, the housing forming one or more network couplers, each of the one or more network couplers configured to receive one of the first set of contact pins or the second set of contact pins.

14. The network connector assembly of claim 13, wherein the upper board member and the lower board member are interchangeable.

15. The network connector assembly of claim 13, wherein the housing forms an upper row of network couplers above the printed circuit board and a lower row of network couplers below the printed circuit board.

16. The network connector assembly of claim 13 wherein the securing tab forms a portion of a latching mechanism.

17. The network connector assembly of claim 16, wherein the latching mechanism has another securing tab engaged with another securing tab aperture formed on the printed circuit board.

18. The network connector assembly of claim 13, wherein the upper board member and the lower board member are received into the housing prior to the printed circuit board.

19. The network connector assembly of claim 13, wherein the upper board member and the lower board member are engaged with the printed circuit board prior to engaging the housing.

20. The network connector assembly of claim 19, wherein the upper board member and the lower board member are soldered onto the printed circuit board prior to engaging the housing.

* * * * *